United States Patent
Shin et al.

(10) Patent No.: US 9,951,422 B2
(45) Date of Patent: Apr. 24, 2018

(54) SEMICONDUCTOR DEVICE MANUFACTURING APPARATUS HAVING PLURALITY OF GAS EXHAUSTING PIPES AND GAS SENSORS

(71) Applicant: Samsung Electronics Co., Ltd., Suwon-si, Gyeonggi-do (KR)

(72) Inventors: Jaechul Shin, Suwon-si (KR); JongCheol Lee, Seoul (KR); Geunkyu Choi, Hwaseong-si (KR); MinHwa Jung, Hwaseong-si (KR); Sukjin Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/285,926

(22) Filed: Oct. 5, 2016

(65) Prior Publication Data

US 2017/0218515 A1 Aug. 3, 2017

(30) Foreign Application Priority Data

Jan. 28, 2016 (KR) ........................ 10-2016-0010753

(51) Int. Cl.
| | | |
|---|---|---|
| *C23C 16/455* | (2006.01) | |
| *C23C 16/40* | (2006.01) | |
| *C23C 16/44* | (2006.01) | |
| *H01L 21/02* | (2006.01) | |
| *C23C 16/458* | (2006.01) | |
| *C23C 16/52* | (2006.01) | |
| *H01L 21/67* | (2006.01) | |

(52) U.S. Cl.
CPC .... *C23C 16/45565* (2013.01); *C23C 16/4412* (2013.01); *C23C 16/458* (2013.01); *C23C 16/52* (2013.01); *H01L 21/67017* (2013.01); *H01L 21/67253* (2013.01)

(58) Field of Classification Search
None
See application file for complete search history.

(56) References Cited

U.S. PATENT DOCUMENTS

| | | |
|---|---|---|
| 6,758,911 B2 | 7/2004 | Campbell et al. |
| 2006/0073276 A1 | 4/2006 | Antonissen |
| 2007/0251453 A1* | 11/2007 | Hongo ............... C23C 16/4408 118/723 AN |

FOREIGN PATENT DOCUMENTS

| | | |
|---|---|---|
| JP | H10312968 | 11/1998 |
| KR | 10-2006-0034775 | 4/2006 |
| KR | 20080092787 | 10/2008 |

(Continued)

*Primary Examiner* — Jethro M Pence
(74) *Attorney, Agent, or Firm* — Myers Bigel, P.A.

(57) ABSTRACT

A semiconductor device manufacturing apparatus includes a shower head at a top of a chamber, a gas supplying part on the shower head, a susceptor in the chamber, and a gas exhausting part under the chamber. The chamber has first and second reaction spaces that are virtually separated from each other. A first gas supply pipe supplies a first gas into the first reaction space and a second gas supply pipe supplies a second gas into the second reaction space. A first gas exhausting pipe is adjacent the first reaction space and a second gas exhausting pipe is adjacent the second reaction space on opposite sides of the susceptor. A first gas sensor connected to the first gas exhausting pipe senses the second gas and a second gas sensor connected to the second gas exhausting pipe senses the first gas.

16 Claims, 9 Drawing Sheets

(56) References Cited

FOREIGN PATENT DOCUMENTS

| KR | 10-2011-0072351 | * | 6/2011 | ........... H01L 21/205 |
| KR | 20110072351 | | 6/2011 | |
| KR | 20140000447 | | 1/2014 | |
| KR | 20150025605 | | 3/2015 | |

* cited by examiner

SEMICONDUCTOR DEVICE MANUFACTURING APPARATUS HAVING PLURALITY OF GAS EXHAUSTING PIPES AND GAS SENSORS

CROSS-REFERENCE TO RELATED APPLICATION

This application claims priority under 35 U.S.C. § 119 to Korean Patent Application No. 10-2016-0010753, filed on Jan. 28, 2016, the disclosure of which is hereby incorporated by reference in its entirety.

BACKGROUND

Embodiments of the inventive concept relate to a semiconductor device manufacturing apparatus having a plurality of gas exhausting pipes and gas sensors.

In order to improve the productivity of semiconductor devices, a semiconductor device manufacturing apparatus using a space division method capable of performing a plurality of processes in one chamber has been proposed. The apparatus requires spatially clear division so that gases are not mixed with each other in the chamber. Embodiments of the inventive concept provide an apparatus capable of quickly monitoring whether gases are mixed with each other in a chamber thereof.

SUMMARY

Embodiments of the inventive concept provide a semiconductor device manufacturing apparatus capable of determining whether space division is clear.

Other embodiments of the inventive concept provide a semiconductor device manufacturing apparatus having a gas sensor capable of sensing and analyzing components of an exhaust gas.

The technical objectives of the inventive concept are not limited to that described above; other objectives may become apparent to those of ordinary skill in the art based on the following descriptions.

In accordance with an aspect of the inventive concept, a semiconductor device manufacturing apparatus includes a shower head disposed at a top of a chamber, a gas supplying part disposed on the shower head, a susceptor disposed in the chamber, and a gas exhausting part disposed under the chamber. The chamber has a first reaction space and a second reaction space that are virtually separated from each other. The gas supplying part includes a first gas supply pipe that supplies a first gas into the first reaction space and a second gas supply pipe that supplies a second gas into the second reaction space. The gas exhausting part includes a first gas exhausting pipe disposed adjacent the first reaction space and a second gas exhausting pipe disposed adjacent the second reaction space, which are disposed at opposite sides of the susceptor, a first gas sensor connected to the first gas exhausting pipe and that senses the second gas, and a second gas sensor connected to the second gas exhausting pipe and that senses the first gas.

In accordance with an aspect of the inventive concept, a semiconductor device manufacturing apparatus includes a chamber having a first reaction space and a second reaction space that are virtually separated from each other, a shower head disposed at a top of the chamber, wherein the shower head includes a first inner room disposed over the first reaction space and a second inner room disposed over the second reaction space, a gas supplying part disposed on the shower head, wherein the gas supplying part includes a first gas supply pipe disposed over the first inner room and a second gas supply pipe disposed over the second inner room, a susceptor disposed in the chamber and on which a plurality of wafers are mounted, a first gas exhausting pipe and a second gas exhausting pipe, which are disposed under the chamber, and a first gas sensor and a second gas sensor connected to the first gas exhausting pipe and the second gas exhausting pipe, respectively. The first gas supply pipe, the first inner room, the first reaction space, and an opening of the first gas exhausting pipe are spatially and vertically aligned with each other. The second gas supply pipe, the second inner room, the second reaction space, and an opening of the second gas exhausting pipe are spatially and vertically aligned with each other.

In accordance with an aspect of the inventive concept, a semiconductor device manufacturing apparatus includes a chamber having first to fourth reaction spaces, a shower head disposed at a top of the chamber, wherein the shower head includes an upper plate having first to fourth gas inlets and a lower plate having partitions to define first to fourth inner rooms spatially connected to the first to fourth gas inlets, respectively, a susceptor disposed in the chamber and on which a plurality of wafers are mounted, a first gas exhausting pipe and a second gas exhausting pipe, which are disposed at both sides of the susceptor, a first gas sensor spatially connected to the first gas exhausting pipe, and a second gas sensor spatially connected to the second gas exhausting pipe. The first gas inlet, the first inner room, the first reaction space, and an opening of the first gas exhausting pipe are spatially aligned with each other; the second gas inlet, the second inner room, the second reaction space, and an opening of the second gas exhausting pipe are spatially and vertically aligned with each other; the third gas inlet, the third inner room, the third reaction space, and an opening of the third gas exhausting pipe are spatially aligned with each other; the fourth gas inlet, the fourth inner room, the fourth reaction space, and an opening of the fourth gas exhausting pipe are spatially and vertically aligned with each other. The second gas sensor senses a first gas passing through the first gas inlet, the first inner room, the first reaction space, and the second gas exhausting pipe, and the first gas sensor senses a second gas passing through the second gas inlet, the second inner room, the second reaction space, and the first gas exhausting pipe. The first gas sensor is insensitive to the first gas and a third gas, and the second gas sensor is insensitive to the second gas and the third gas. The third gas passes through the third gas inlet, the third inner room, the third reaction space, and the first and second gas exhausting pipes.

In accordance with an aspect of the inventive concept, a semiconductor device manufacturing apparatus includes a chamber defining a first reaction space and a second reaction space, a shower head at a top of the chamber, a gas supply part, a susceptor in the chamber and configured to hold a plurality of wafers, a first gas exhaust pipe, a second gas exhaust pipe, a first gas sensor, and a second gas sensor. The shower head defines a first inner room above the first reaction space and a second inner room above the second reaction space. The gas supply part includes a first gas supply pipe connected to the first inner room of the shower head and a second gas supply pipe connected to the second inner room of the shower head. The first gas supply pipe is configured to supply a first gas through the first inner room and to the first reaction space. The second gas supply pipe configured to supply a second gas through the second inner room and to the second reaction space. The first gas exhaust pipe extends from inside to outside the chamber and includes at least one first exhaust opening adjacent a first side of the susceptor. The second gas exhaust pipe extends from inside to outside the chamber and includes at least one second exhaust opening adjacent a second, opposite side of the susceptor. The first gas sensor is in fluid communication with the first exhaust pipe and is configured to sense the second gas in a first exhaust gas flowing from the first reaction space and through the first exhaust pipe. The second gas sensor is in fluid communication with the second exhaust pipe and configured to sense the first gas in a second exhaust gas flowing from the second reaction space and through the second exhaust pipe.

Details of other embodiments are included in the detailed description and the drawings.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1A:
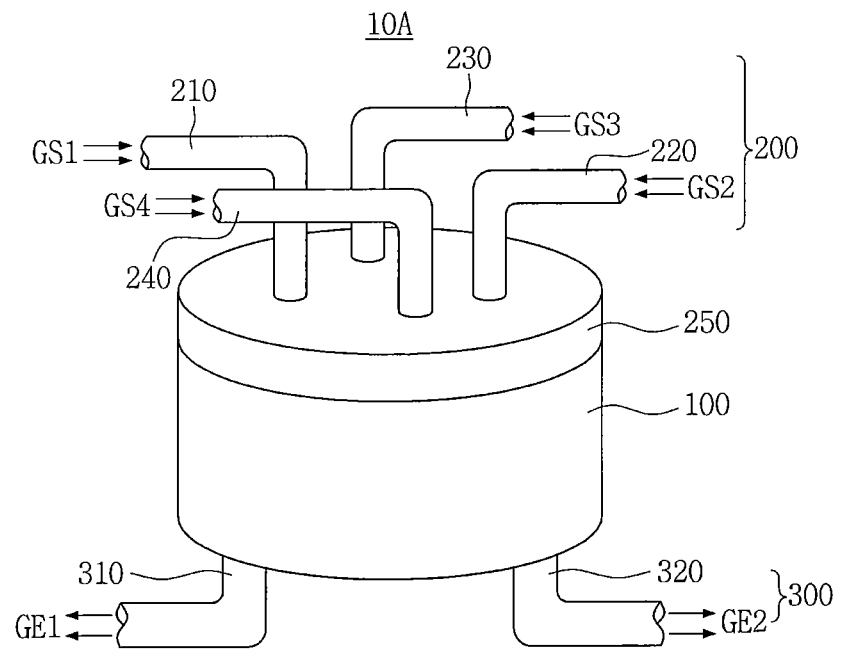
FIGS. 1A and 1B are perspective views of semiconductor device manufacturing apparatuses according to embodiments of the inventive concept.

As used herein, the term "spatially aligned" should be interpreted to mean that elements are not located on a straight line but are located in a space extending in one direction. For example, it should be understood that when elements are located at a left side from the center in the drawing, the elements may be spatially aligned with each other in a left space, and when the elements are located at a right side, the elements may be spatially aligned with each other in a right space.

Figure 1B:
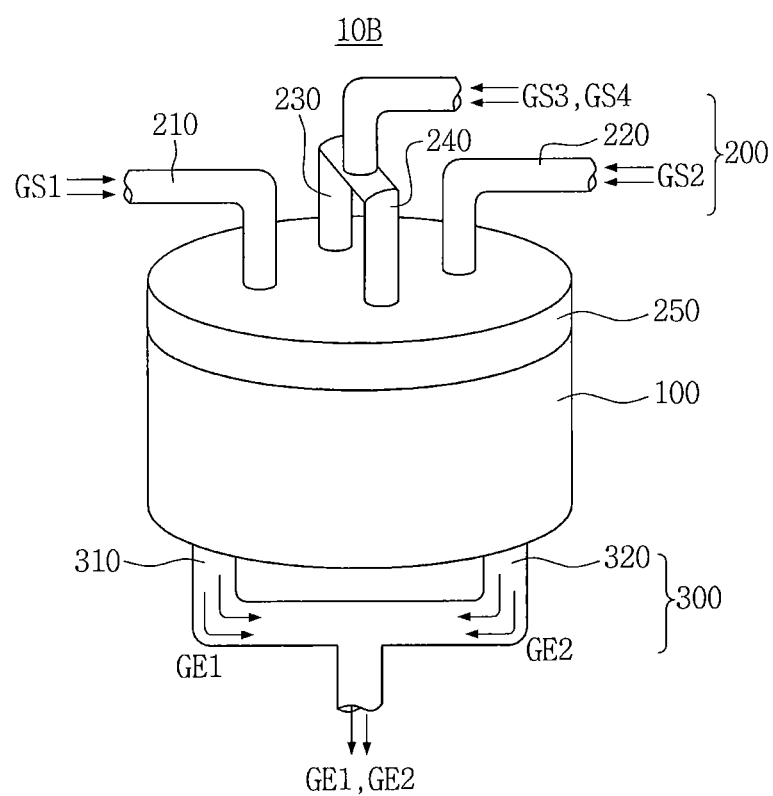

FIGS. 1A and 1B are perspective views of semiconductor device manufacturing apparatuses 10A and 10B according to embodiments of the inventive concept.

Referring to FIGS. 1A and 1B, each of the semiconductor device manufacturing apparatuses 10A and 10B according to the embodiments of the inventive concept may include a gas supply or supplying part 200 disposed above a chamber 100 and a gas exhaust or exhausting part 300 disposed below or under the chamber 100. A shower head 250 may be disposed at a top of the chamber 100.

The gas supplying part 200 may supply various gases into the chamber 100. For example, the gas supplying part 200 may supply a precursor, a reaction gas, a purge gas, and a cleaning gas. The gas supplying part 200 may include a plurality of gas supplying pipes 210, 220, 230, and 240 disposed on the shower head 250 of the chamber 100 in a radial orientation or shape. For example, the gas supplying part 200 may include a first gas supplying pipe 210 for supplying a first gas GS1, a second gas supplying pipe 220 for supplying a second gas GS2, a third gas supplying pipe 230 for supplying a third gas GS3, and a fourth gas supplying pipe 240 for supplying a fourth gas GS4. The first gas supplying pipe 210 and the second gas supplying pipe 220 may be disposed to be opposite to each other. For example, when viewed in a top view, the first gas supply or supplying pipe 210 may be disposed on a left half portion of the shower head 250, and the second gas supply or supplying pipe 220 may be disposed on a right half portion of the shower head 250. The third gas supplying pipe 230 and the fourth gas supplying pipe 240 may be disposed to be opposite to each other. For example, when viewed in a top view, the third gas supplying pipe 230 may be disposed on an upper half portion of the shower head 250, and the fourth gas supplying pipe 240 may be disposed on a lower half portion of the shower head 25Q. According to some embodiments, the third gas supplying pipe 230 may be disposed on a back or rear portion of the shower head 250 and the fourth gas supplying pipe 240 may be disposed on a front portion of the shower head 250. The left half portion, the right half portion, the upper half (or back) portion, and the lower half (or front) portion, which are relative concepts, may be compatible with each other.

In other embodiments, the first gas supplying pipe 210 and the second gas supplying pipe 22Q may be symmetrically disposed. Further, the third gas supplying pipe 230 and the fourth gas supplying pipe 240 may also be symmetrically disposed (e.g., about a center of the chamber 100 or the shower head 250). In additional other embodiments, the first gas supplying pipe 210 and the second gas supplying pipe 220 may be disposed to have an angle between them in the range of 90° to 180° around the center of the chamber 100 or the shower head 250 (e.g., with the angle measured in a circumferential direction). (For example, the first gas supplying pipe 210 and the second gas supplying pipe 220 may also be disposed on the same upper half portion or lower half portion.) The third gas supplying pipe 230 and the fourth gas supplying pipe 240 may also be disposed to have an angle between them in the range of 90° to 180° around the center of the chamber 100 or the shower head 250 (e.g., with the angle measured in a circumferential direction). Referring to FIG. 1A, the first to fourth gas supplying pipes 210, 220, 230, and 240 may be separated or spaced apart from each other. Referring to FIG. 1B, the third gas supplying pipe 230 and the fourth gas supplying pipe 240 may be connected to or integrated with each other. The first gas GS1 may include a precursor containing silane ($SiH_4$) or a metal compound. The second gas GS2 may include a reactive gas such as an oxidizing agent or a nitriding agent. The third gas GS3 and/or the fourth gas GS4 may include a purge gas such as helium (He) or argon (Ar). In other embodiments, each of the first to fourth gases GS1 to GS4 may include a cleaning gas such as $NF_3$.

The gas exhausting part 300 may exhaust the gases from the inside of the chamber 100. The gas exhausting part 300 may include at least two gas exhausting pipes 310 and 320. For example, the gas exhausting part 300 may include a first gas exhaust or exhausting pipe 310 spatially and directionally aligned with the first gas supplying pipe 210 to be close thereto, and a second gas exhaust or exhausting pipe 320 spatially and directionally aligned with the second gas supplying pipe 220 to be close thereto. Referring to FIG. 1A, the first gas exhausting pipe 310 and the second gas exhausting pipe 320 may be separated or spaced apart from each other. Referring to FIG. 1B, the first gas exhausting pipe 310 and the second gas exhausting pipe 320 may be connected to or integrated with each other. The characteristics of the semiconductor device manufacturing apparatuses 10A and 10B illustrated in FIGS. 1A and 1B may be selectively compatible with each other.

Figure 2A:
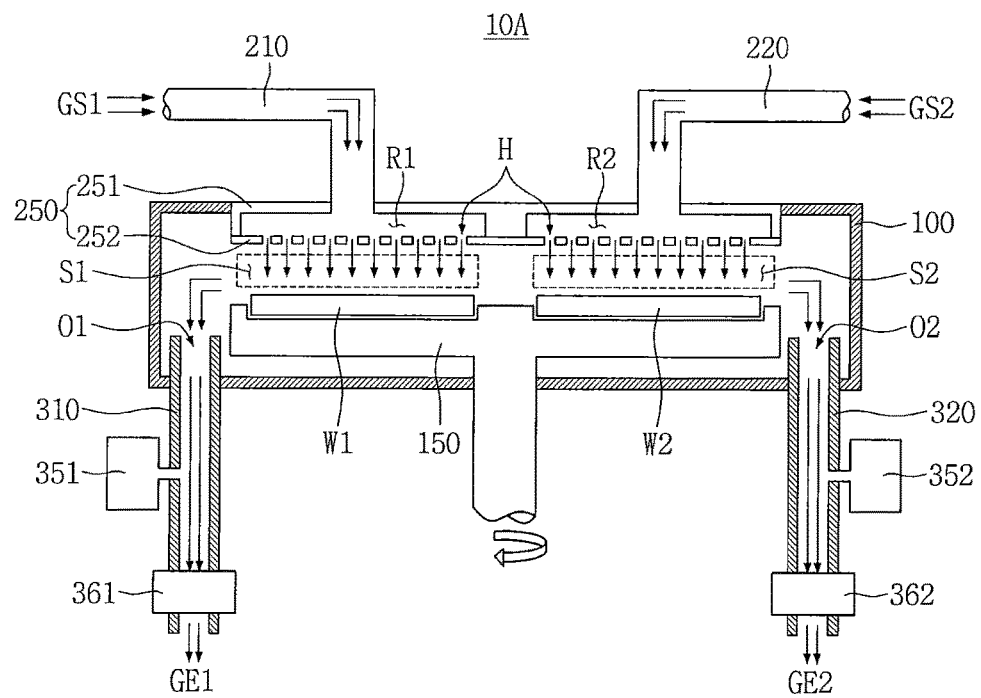
FIGS. 2A and 2B are internal cross-sectional views of the semiconductor device manufacturing apparatuses according to the embodiments of the inventive concept.
Figure 2B:
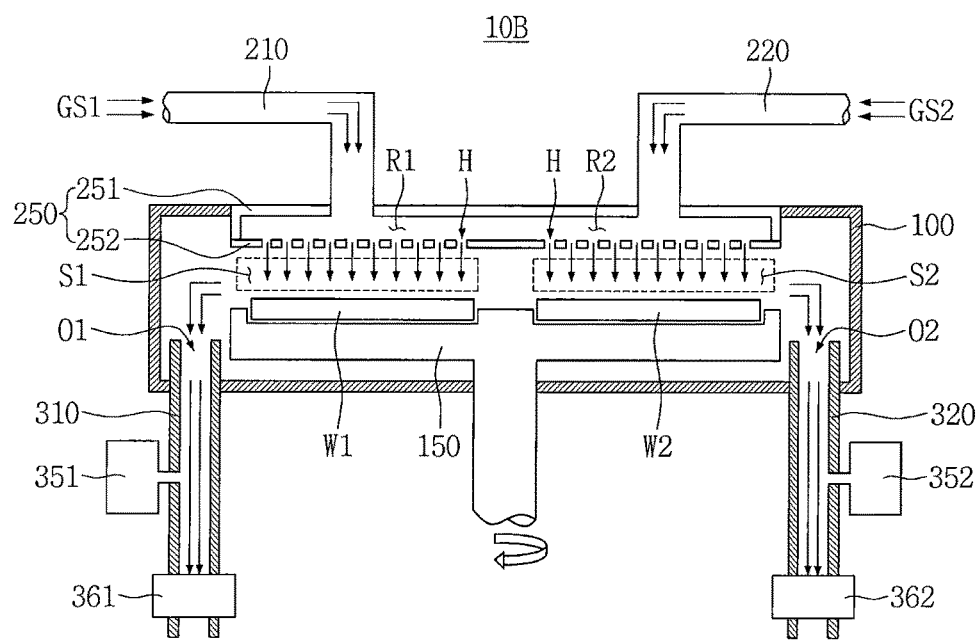

FIGS. 2A and 2B are internal cross-sectional views of the semiconductor device manufacturing apparatuses 10A and 10B according to the embodiments of the inventive concept.

Referring to FIGS. 2A and 2B, each of the semiconductor device manufacturing apparatuses 10A and 10B according to the embodiments of the inventive concept may include the gas supplying part 200 disposed above the chamber 100, a susceptor 150 disposed in the chamber 100, and the gas exhausting part 300 disposed below or under the chamber 100. The chamber 100 may define or provide reaction spaces S1 and S2 in which various processes are performed, and the chamber 100 may maintain a vacuum. The reaction spaces S1 and S2 are one space which is not physically separated (e.g., the reaction spaces S1 and S2 are in communication with each other) but may be virtually separated so that different processes are respectively performed therein. For example, in a first reaction space S1, a material layer may be formed by performing a deposition process, and in a second reaction space S2, an oxidized material layer or a nitride material layer may be formed by performing an oxidizing process or a nitriding process. Referring to FIGS. 1A and 1B, it is assumed and illustrated that the first gas supplying pipe 210 and the second gas supplying pipe 220 are respectively disposed on the left half portion and the right half portion, and the third gas supplying pipe 230 and the fourth gas supplying pipe 240 are respectively disposed on the upper half or rear portion and the lower half or front portion. For example, it is assumed and illustrated that the gas supplying pipes 210, 220, 230, and 240 are respectively disposed on quadrants of the shower head 250. According to some embodiments, each of the gas supplying pipes 210, 220, 230, and 240 is disposed on a different quadrant of the shower head 250.

The shower head 250 may include an upper plate 251 and a lower plate 252, which define or form a plurality of inner rooms R1 and R2. The gas supplying pipes 210 and 220 may pass through or connect to the upper plate 251 to supply various gases GS1 and GS2 into the inner rooms R1 and R2. The lower plate 252 may include a plurality of gas outlets H for providing the gases GS1 and GS2 in the inner rooms R1 and R2 onto the susceptor 150 in the chamber 100. The shower head 250 may supply the gases GS1 and GS2 supplied from the gas supplying part 200 to be spatially separated from each other in the chamber 100. For example, the first gas GS1 passing through the first gas supplying pipe 210 and the first inner room R1 of the shower head 250 may be supplied into the first reaction space S1 in the chamber 100 and provided onto a first wafer W1 mounted on the susceptor 150. Further, the second gas GS2 passing through the second gas supplying pipe 220 and the second inner room R2 of the shower head 250 may be supplied into the second reaction space S2 in the chamber 100 and provided onto a second wafer W2 mounted on the susceptor 150. Referring further to FIGS. 1A and 1B, the shower head 250 may further include a third inner room and a fourth inner room, through which the gases GS3 and GS4 respectively supplied through the third gas supplying pipe 230 and the fourth gas supplying pipe 240 pass. The chamber 100 may also further include a third reaction space and a fourth reaction space to which the gases GS3 and GS4 passing through the third inner room and the fourth inner room are respectively provided.

Referring to FIG. 2A, the inner rooms R1 and R2 of the shower head 250 may be virtually, spatially, and individually separated from each other, and referring to FIG. 2B, the inner rooms R1 and R2 may be spatially connected to and/or integrated with each other (e.g., the inner rooms R1 and R2 may be in communication with each other).

The plurality of wafers W1 and W2 may be mounted on the susceptor 150. The susceptor 150 may rotate in a state in which the wafers W1 and W2 are mounted on or to the susceptor 150. The wafers W1 and W2 may be disposed on the susceptor 150 to be aligned with the inner rooms R1 and R2 and the reaction spaces S1 and S2 of the shower head 250.

As described above, the gas exhausting part 300 may include at least two gas exhausting pipes 310 and 320. Openings O1 and O2 of the gas exhausting pipes 310 and 320 may be symmetrically disposed on both (e.g., opposite) sides of the susceptor 150. For example, the opening O1 of the first gas exhausting pipe 310 may be directionally and vertically aligned with the first gas supplying pipe 210, and the opening O2 of the second gas exhausting pipe 320 may be directionally and vertically aligned with the second gas supplying pipe 220. Therefore, the first gas exhausting pipe 310 may mainly exhaust the first gas GS1 provided from the first gas supplying pipe 210 to the first reaction space S1 of the chamber 100, and the second gas exhausting pipe 320 may mainly exhaust the second gas GS2 provided from the second gas supplying pipe 220 to the second reaction space S2 of the chamber 100. In addition, the first gas exhausting pipe 310 may exhaust the first gas GS1, the third gas GS3, and the fourth gas GS4, and the second gas exhausting pipe 320 may exhaust the second gas GS2, the third gas GS3, and the fourth gas GS4. That is, the third gas GS3 and the fourth gas GS4 may be exhausted through both the first gas exhausting pipe 310 and the second gas exhausting pipe 320.

The gas exhausting part 300 may include a first gas sensor 351 disposed at or close to the first gas exhausting pipe 310 and a second gas sensor 352 disposed at or close to the second gas exhausting pipe 320. The first gas sensor 351 may be connected to the first gas exhausting pipe 310, and the second gas sensor 352 may be connected to the second gas exhausting pipe 320.

Therefore, first elements including the first gas supplying pipe 210, the first inner room R1, the first reaction space S1, the first gas exhausting pipe 310, and the first gas sensor 351 may be spatially and vertically aligned with each other, and second elements including the second gas supplying pipe 220, the second inner room R2, the second reaction space S2, the second gas exhausting pipe 320, and the second gas sensor 352 may be spatially and vertically aligned with each other. The first elements and the second elements may be disposed to be opposite to each other, to be symmetric, or to have an angle in the range of 90° to 180° between them around the center of the chamber 100 or the shower head 250 (e.g., with the angle measured in a circumferential direction).

Each of the first gas sensor 351 and the second gas sensor 352 may include a gas sensor. For example, the first gas sensor 351 may analyze components of a first exhaust gas GE1 by collecting the first exhaust gas GE1 exhausted through the first gas exhausting pipe 310, and the second gas sensor 352 may analyze components of a second exhaust gas GE2 by collecting the second exhaust gas GE2 exhausted through the second gas exhausting pipe 320. More specifically, the first gas sensor 351 may be insensitive to the first gas GS1 supplied through the first gas supplying pipe 210 and sensitive to the second gas GS2 supplied through the second gas supplying pipe 220. The second gas sensor 352 may be sensitive to the first gas GS1 supplied through the first gas supplying pipe 210 and insensitive to the second gas GS2 supplied through the second gas supplying pipe 220. In other words, the first gas sensor 351 may not sense the first gas GS1 and may sense the second gas GS2. The second gas sensor 352 may sense the first gas GS1 and may not sense the second gas GS2. For example, when the first gas GS1 includes a precursor, the first gas sensor 351 may be insensitive to the precursor, and the second gas sensor 352 may be sensitive to the precursor. Further, for example, when the second gas GS2 includes a reaction gas, the first gas sensor 351 may be sensitive to the reaction gas, and the second gas sensor 352 may be insensitive to the reaction gas.

According to embodiments of the inventive concept, when the first gas GS1 supplied into the chamber 100 through the first gas supplying pipe 210 is mixed with the second exhaust gas GE2 and exhausted through the second gas exhausting pipe 320, the second gas sensor 352 may sense the first gas GS1 mixed with the second exhaust gas GE2. Further, when the second gas GS2 supplied into the chamber 100 through the second gas supplying pipe 220 is mixed with the first exhaust gas GE1 and exhausted through the first gas exhausting pipe 310, the first gas sensor 351 may sense the second gas GS2 mixed with the first exhaust gas GE1.

According to embodiments of the inventive concept, whether the first gas GS1 and the second gas GS2 are maintained to be spatially separated from each other in the chamber 100 may be determined using the first gas sensor 351 and the second gas sensor 352. Specifically, whether the first gas GS1 and the second gas GS2 spatially cross (e.g., mix) in the chamber 100 may be sensed in real time. When it is determined that the first gas GS1 and the second gas GS2 are maintained to be spatially separated from each other in the chamber 100, the second gas GS2 does not flow into the first gas exhausting pipe 310, and the first gas GS1 does not flow into the second gas exhausting pipe 320. Therefore, semiconductor device manufacturing processes performed in the chamber 100 may be monitored in real time using the first gas sensor 351 and the second gas sensor 352. Information on the components of the first exhaust gas GE1 sensed and analyzed by the first gas sensor 351 and information on the components of the second exhaust gas GE2 sensed and analyzed by the second gas sensor 352 may be provided to a computer in real time and displayed on a monitor.

The gas exhausting part 300 may further include a first gas pump 361 disposed in or on the first gas exhausting pipe 310 and a second gas pump 362 disposed in or on the second gas exhausting pipe 320. The first gas pump 361 may adjust an exhaust flow rate and an exhaust pressure of the first exhaust gas GE1 exhausted through the first gas exhausting pipe 310, and the second gas pump 362 may adjust an exhaust flow rate and an exhaust pressure of the second exhaust gas GE2 exhausted through the second gas exhausting pipe 320. For example, each of the first gas pump 361 and the second gas pump 362 may include a turbo pump.

For example, when the first gas sensor 351 senses that the second gas GS2 is mixed with the first exhaust gas GE1 exhausted through the first gas exhausting pipe 310, process conditions may be modified or adjusted so that a flow rate and/or a pressure of the second gas GS2 supplied into the second reaction space S2 in the chamber 100 through the second gas supplying pipe 220 is reduced, or the process conditions may be modified or adjusted so that the exhaust flow rate and/or the exhaust pressure of the second exhaust gas GE2 exhausted through the second gas exhausting pipe 320 is increased by the second gas pump 362.

For example, when the second gas sensor 352 senses that the first gas GS1 is mixed with the second exhaust gas GE2 exhausted through the second gas exhausting pipe 320, the process conditions may be modified or adjusted so that a flow rate and/or a pressure of the first gas GS1 supplied into the first reaction space S1 in the chamber 100 through the first gas supplying pipe 210 is reduced, or the process conditions may be modified or adjusted so that the exhaust flow rate and/or the exhaust pressure of the first exhaust gas GE1 exhausted through the first gas exhausting pipe 310 is increased by the first gas pump 361. In other embodiments, the process conditions may be modified or adjusted so that a supply flow rate of each of the third gas GS3 and/or the fourth gas GS4 supplied into the chamber 100 through the third gas supplying pipe 230 and/or the fourth gas supplying pipe 240 is increased and/or reduced.

Therefore, according to the inventive concept, whether the reaction spaces S1 and S2, which are virtual, in the chamber 100 are virtually and spatially separated from each other may be clearly monitored in real time, and the processes may be adjusted so that the first gas GS1 and the second gas GS2 are not mixed with each other in the reaction spaces S1 and S2. Specifically, while a first process is being stably performed in the first reaction space S1 and a second process is being stably performed in the second reaction space S2, whether the first process and the second process are affected by each other may be monitored in real time, and the process conditions may be modified and adjusted in response to the monitoring.

FIGS. 3(*a*) to 3(*f*) are bottom views conceptually illustrating upper plates 251*a* to 251*f* of the shower head 250 according to various embodiments of the inventive concept. Referring to FIG. 3(*a*), an upper plate 251*a* according to an embodiment of the inventive concept may include first to fourth gas inlets J1, J2, J3, and J4 connected to the first to fourth gas supplying pipes 210, 220, 230, and 240, respectively. The first gas inlet J1 and the second gas inlet J2 may be symmetrically disposed to be opposite to each other and to be connected to the first gas supplying pipe 210 and the second gas supplying pipe 220. The third gas inlet J3 and the fourth gas inlet J4 may also be symmetrically disposed to be opposite to each other and to be connected to the third gas supplying pipe 230 and the fourth gas supplying pipe 240.

Referring to FIG. 3(*b*), an upper plate 251*b* according to an embodiment of the inventive concept may include first to fourth gas inlets J1 to J4, and the first gas inlet J1 and the second gas inlet J2 may be disposed to have an angle in the range of 90° to 180° between them around the center of the shower head 250 (e.g., with the angle measured in a circumferential direction). For example, the first gas inlet J1 and/or the second gas inlet J2 may be disposed closer to any one of the third gas inlet J3 and the fourth gas inlet J4. As illustrated, the first gas inlet J1 and the second gas inlet J2 may be disposed closer to the fourth gas inlet J4 than the third gas inlet J3. The third gas inlet J3 and the fourth gas inlet J4 may be disposed to be opposite to each other. Specifically, in a top view, the first gas inlet J1 and the second gas inlet J2 may be disposed on the same upper half or rear portion of the upper plate 251b. (Alternatively, the first gas inlet J1 and the second gas inlet J2 may be disposed on a lower half or front portion, a left half portion, or a right half portion of the upper plate 251b.)

Figure 3A:
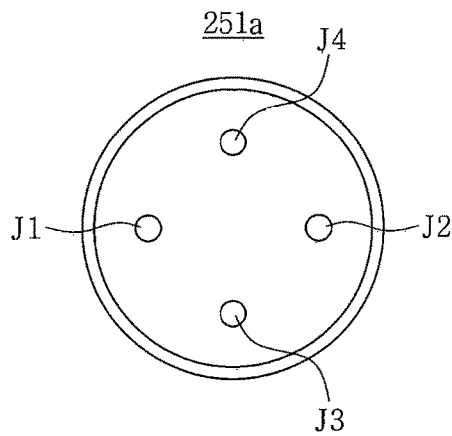
FIGS. 3A to 3F are bottom views conceptually illustrating upper plates according to various embodiments of the inventive concept.
Figure 3B:
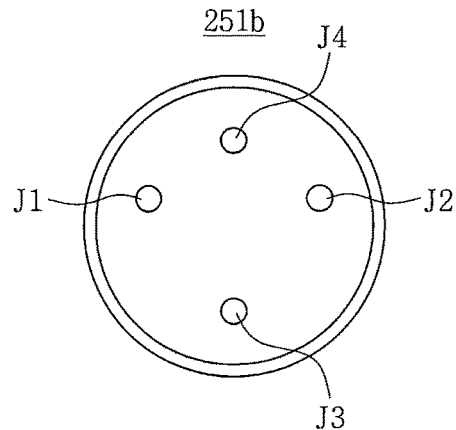
Figure 3C:
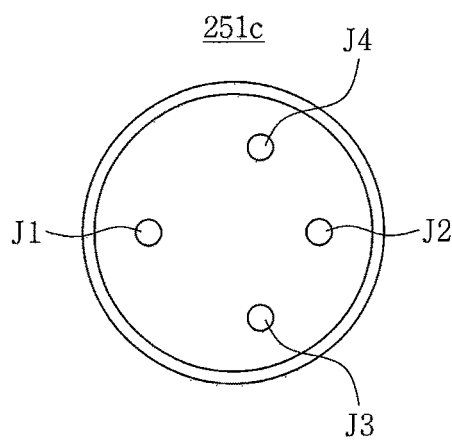

Referring to FIG. 3(c), an upper plate 251c according to an embodiment of the inventive concept may include first to fourth gas inlets J1 to J4, and the third gas inlet J3 and the fourth gas inlet J4 may be disposed to have an angle in the range of 90° to 180° between them around the center of the shower head 250 (e.g., with the angle measured in a circumferential direction). For example, the third gas inlet J3 and/or the fourth gas inlet J4 may be disposed closer to any one of the first gas inlet J1 and the second gas inlet J2. As illustrated, the third gas inlet J3 and the fourth gas inlet J4 may be disposed closer to the second gas inlet J2 than the first gas inlet J1.

Figure 3D:
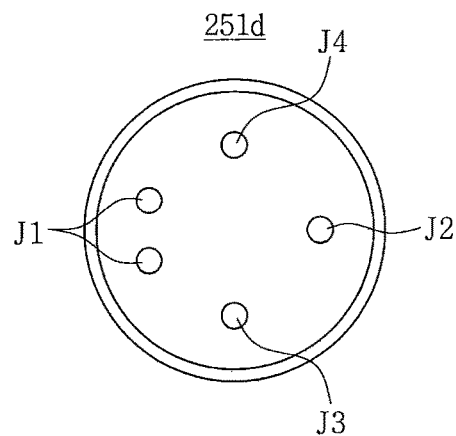
Figure 3E:
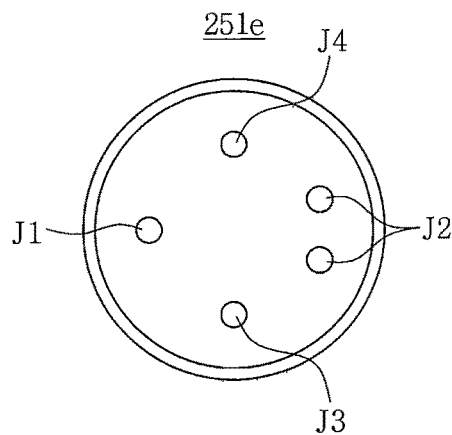
Figure 3F:
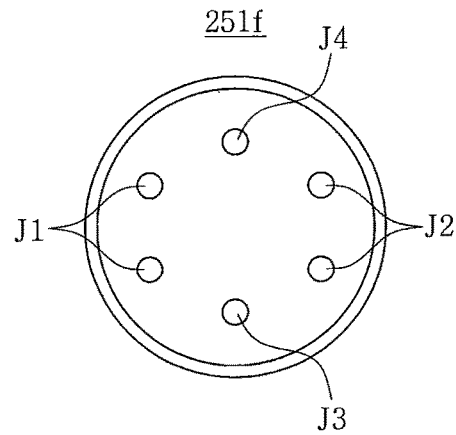

Referring to FIGS. 3(d) to 3(f), each of upper plates 251d and 251e according to various embodiments of the inventive concept may include a plurality of first gas inlets 31, while referring to FIG. 3(e), the upper plate 251e according to an embodiment of the inventive concept may include a plurality of second gas inlets J2, and referring to FIG. 3(f) the upper plate 251f according to an embodiment of the inventive concept may include a plurality of first and second gas inlets 31 and J2. Since the characteristics of the upper plates 251a to 251f illustrated in FIGS. 3(a) to 3(f) may be combined with each other, although not specifically illustrated therein, the characteristics of the upper plates 251a to 251f may be variously combined and applied. In another embodiment, the upper plates 251a to 251f may individually include a plurality of third gas inlets J3 and/or fourth gas inlets J4.

Referring further to FIGS. 1A and 1B, the first to fourth gas supplying pipes 210 to 240 may be disposed to be connected to the first to fourth gas inlets J1 to J4, respectively. For example, the first and second gas supplying pipes 210 and 220 may be disposed to have an angle from each other in the range of 90° to 180° around the center of the shower head 250 (e.g., with the angle measured in a circumferential direction), and each of the first and second gas supplying pipes 210 and 220 may be configured to be a plurality of first and second gas supplying pipes 210 and 220.

Referring further to FIGS. 2A and 2B, the first to fourth gas inlets J1 to J4 may be respectively aligned with the inner rooms R1 and R2 of the shower head 250. In the drawing, only the first inner room R1 and the second inner room R2 are illustrated.

Figure 4A:
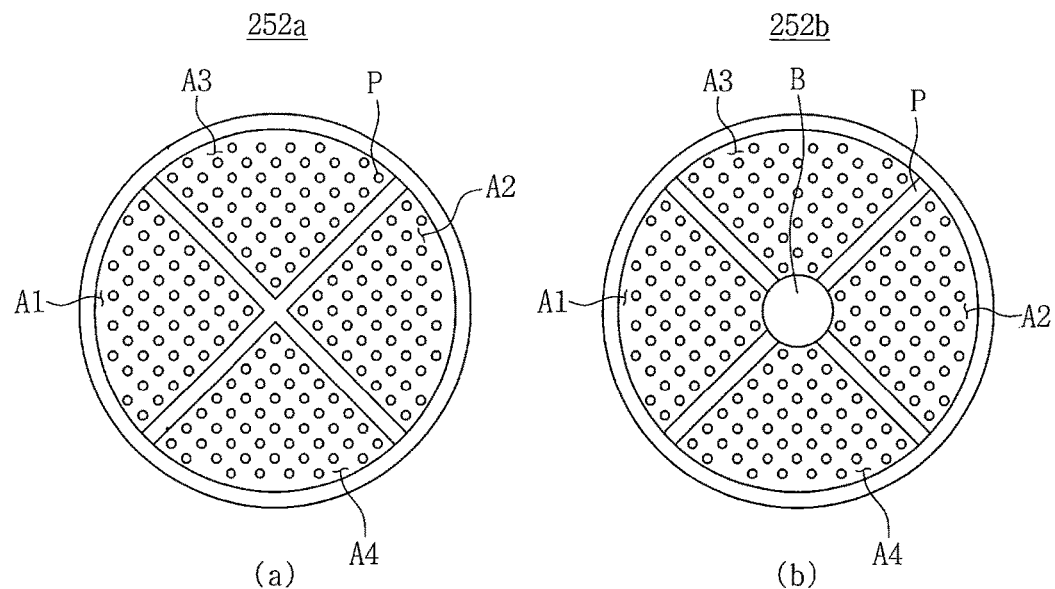
FIGS. 4A to 4C are top views conceptually illustrating lower plates according to various embodiments of the inventive concept.
Figure 4B:
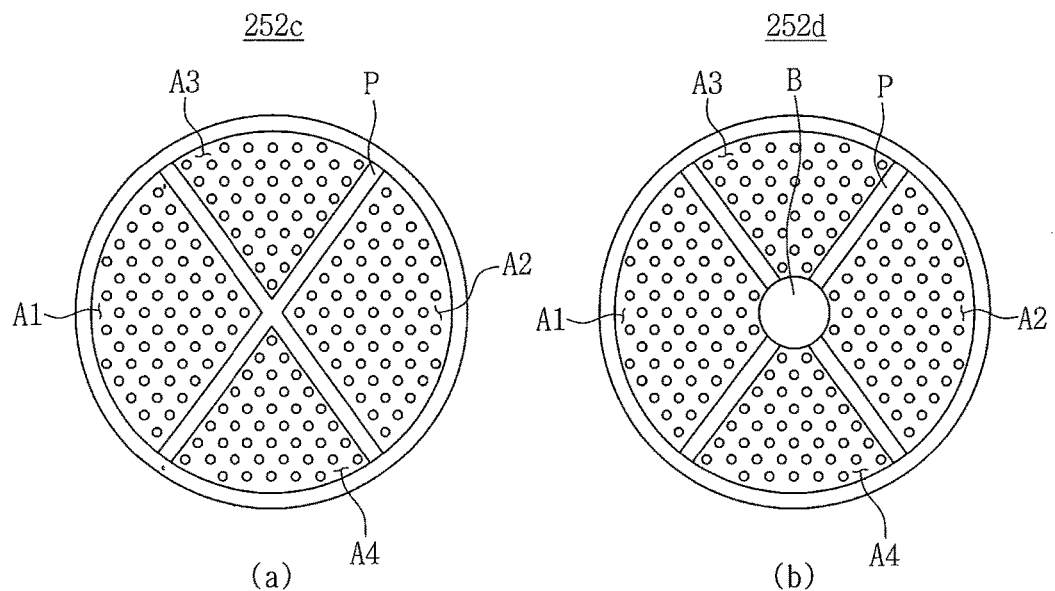
Figure 4C:
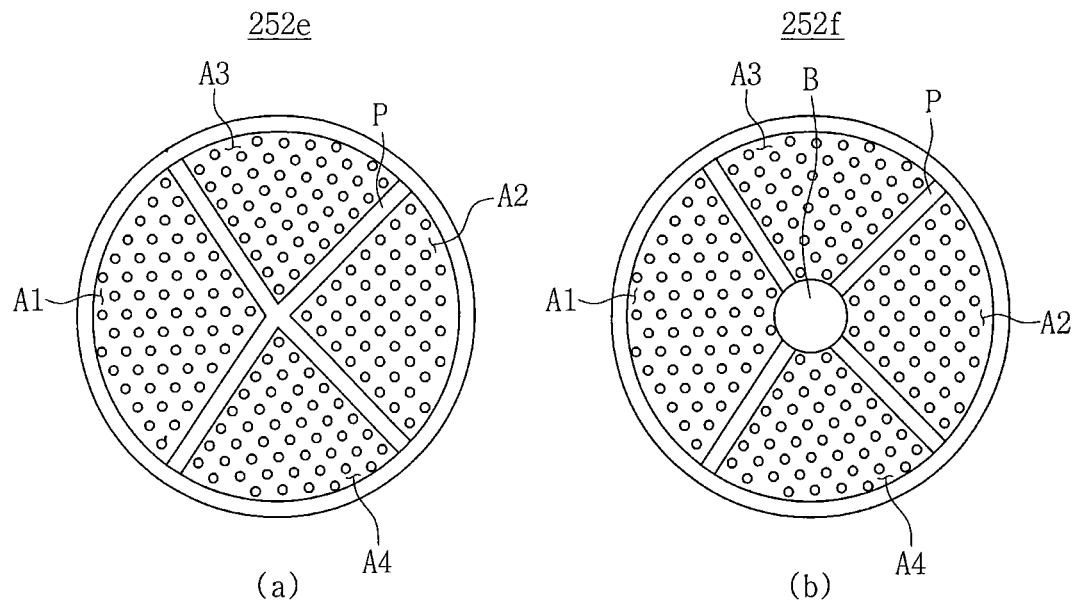

FIGS. 4A to 4C are top views conceptually illustrating lower plates 252a to 252f according to various embodiments of the inventive concept.

Referring to FIGS. 4A to 4C, each of the lower plates 252a to 252f according to various embodiments of the inventive concept may include areas, sectors or quadrants A1 to A4, which are virtually and spatially separated by partitions P so as to define the virtually and spatially divided inner rooms R1 and R2. Referring to FIGS. 1A and 1B, the separated areas A1 to A4 may be spatially or directionally aligned with the first to fourth gas supplying pipes 210, 220, 230, and 240, respectively. Alternatively, referring to FIGS. 3(a) to 3(f), the separated areas A1 to A4 may be spatially or directionally aligned with the gas inlets J1 to J4 of the various upper plates 251a to 251f. Each of the partitions P may have a protruding dam or wall shape. Therefore, the inner rooms R1 and R2 of the shower head 250 may not be virtually, spatially, and completely separated from each other but partially separated from and connected to each other. In other embodiments, the partitions P may virtually, spatially, and completely separate the inner rooms R1 and R2 of the shower head 250. Referring to FIG. 4A(b), the lower plate 252b may further include a baffle plate B disposed at the center thereof. The baffle plate B may physically and spatially space the separated areas A1 to A4 apart from each other. Referring to FIGS. 4B and 4C, the partitions P may be disposed in various orientations or shapes so that sizes of the separated areas A1 to A4 are variously changed. Time in which the first to fourth gases GS1 to GS4 react with the wafers W1 to W4 may be variously adjusted according to an arrangement of the partitions P.

Figure 5A:
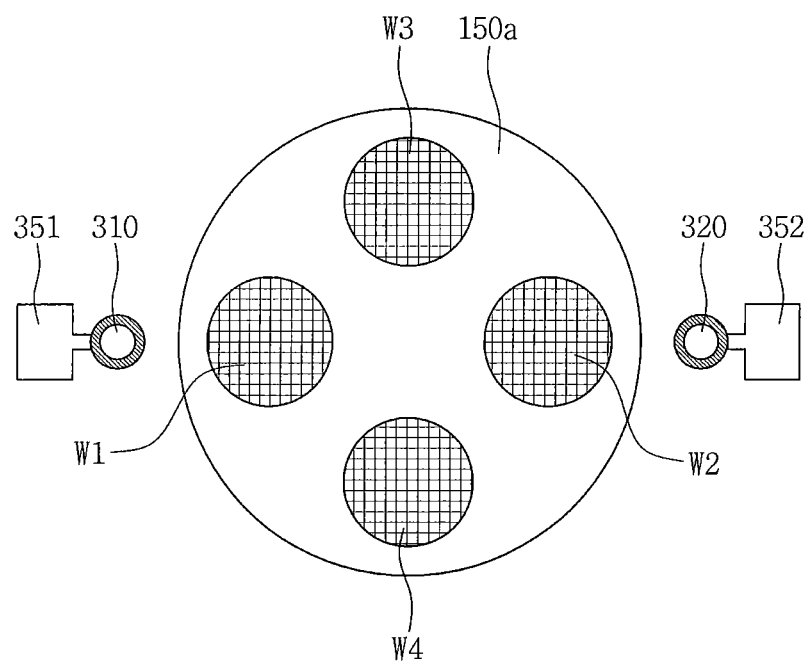
FIGS. 5A to 5C are top views conceptually illustrating a susceptor, first and second gas exhausting pipes, and first and second gas sensors according to embodiments of the inventive concept.
Figure 5B:
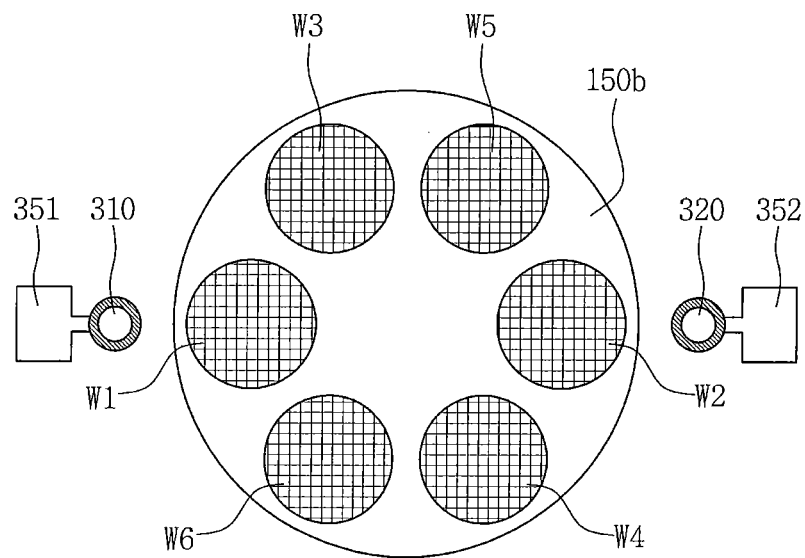
Figure 5C:
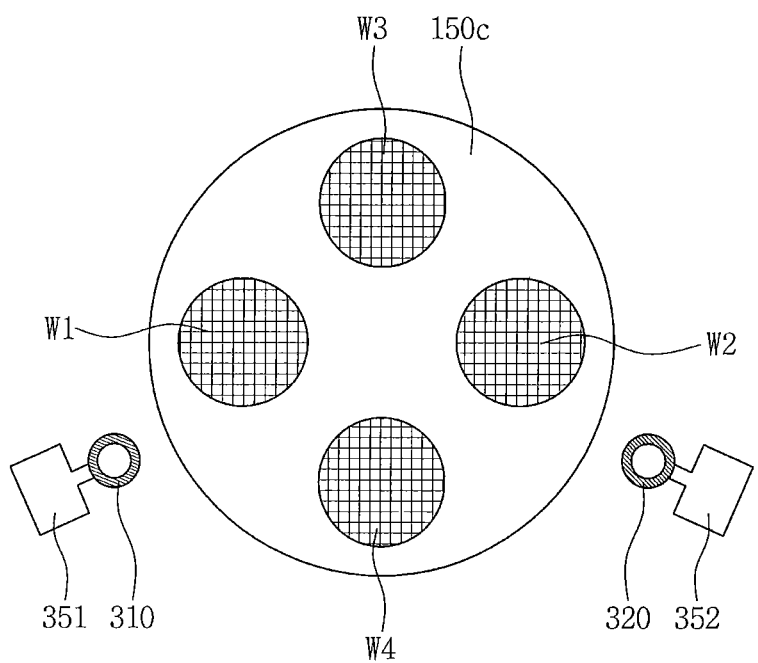

FIGS. 5A to 5C are top views conceptually illustrating susceptors 150a to 150c, first and second gas exhausting pipes 310 and 320, and first and second gas sensors 351 and 352 according to various embodiments of the inventive concept.

Referring to FIGS. 5A to 5C, the susceptors 150a to 150c according to various embodiments of the inventive concept may receive a plurality of wafers W1 to W6 to be mounted thereon. The openings O1 and O2 of the first gas exhausting pipe 310 and the second gas exhausting pipe 320 may be spatially or directionally and vertically aligned with the first gas supplying pipe 210 and the second gas supplying pipe 220, and the first gas inlet J1 and the second gas inlet J2, respectively. Alternatively, the first gas exhausting pipe 310 and the second gas exhausting pipe 320 may be spatially or directionally aligned with a first inner area A1 and a second inner area A2 of lower plates 252a to 252f of a shower head 250. As described above, the first gas sensor 351 may be connected to the first gas exhausting pipe 310, and the second gas sensor 352 may be connected to the second gas exhausting pipe 320. As the first gas sensor 351 and the second gas sensor 352 are adjacent the first gas exhausting pipe 310 and the second gas exhausting pipe 320, respectively, the components of the first exhaust gas GE1 and the second exhaust gas GE2 may be analyzed in real time. Referring further to FIG. 5C, the first gas exhausting pipe 310 and the second gas exhausting pipe 320 may be disposed to have an angle from each other in the range of 90° to 180° around the center of the shower head 250 (e.g., with the angle measured in a circumferential direction). For example, referring to FIGS. 3(a) to 3(f), the first gas exhausting pipe 310 and the second gas exhausting pipe 320 may be disposed to be directionally aligned with the first to fourth gas inlets J1 to J4. Alternatively, referring to FIG. 5C, the first and second gas exhausting pipes 310 and 320 may not be opposite to each other but may be symmetrically disposed.

Figure 6A:
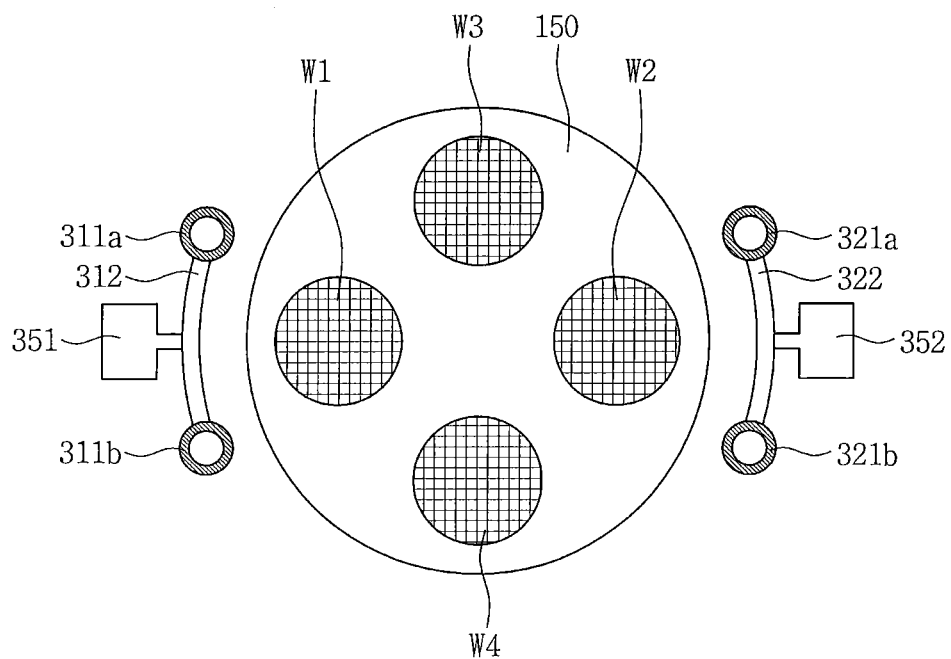
FIGS. 6A, 7A and 8A are top views conceptually illustrating a susceptor, first and second gas exhausting pipes, and first and second gas sensors according to embodiments of the inventive concept.
Figure 6B:
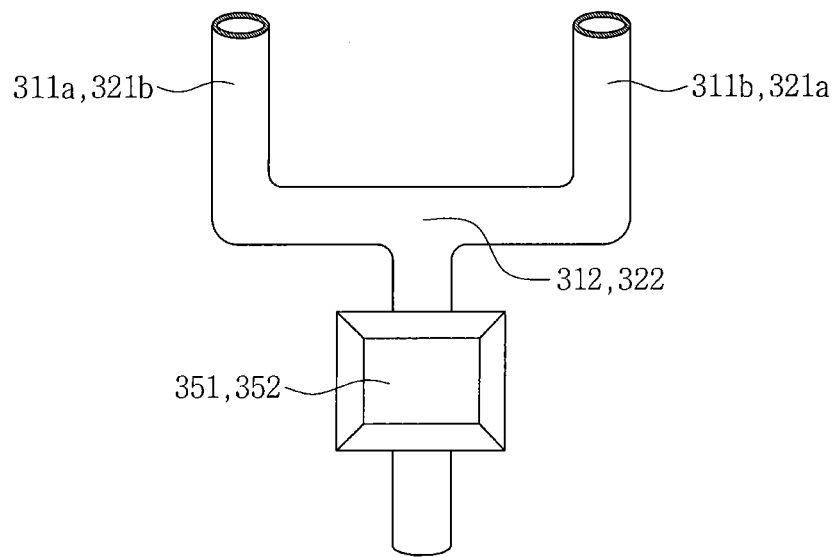
FIGS. 6B, 7B and 8B are perspective views conceptually illustrating the first and second gas exhausting pipes of FIGS. 6A, 7A and 7B, respectively.
Figure 7A:
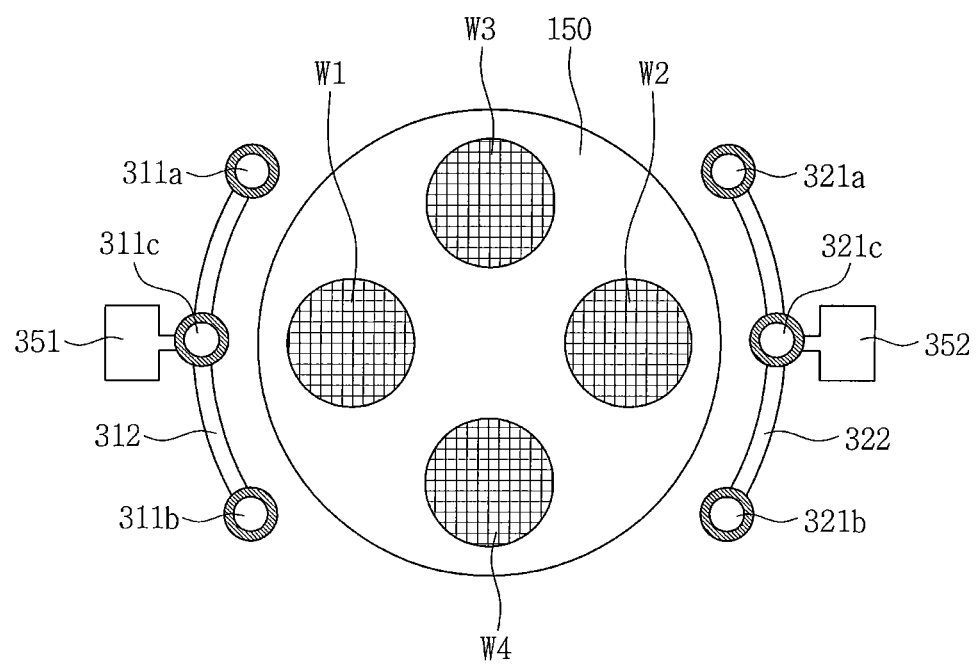
Figure 7B:
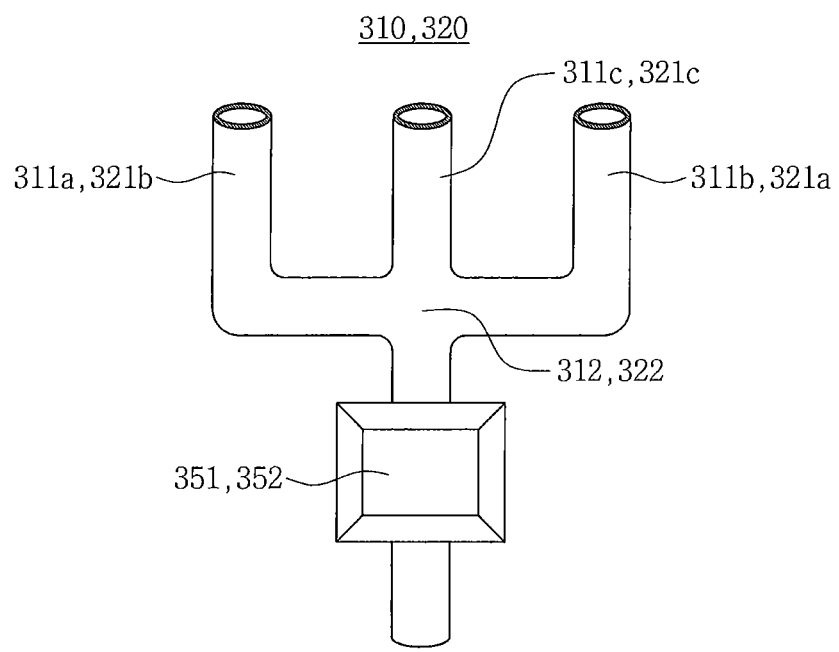
Figure 8A:
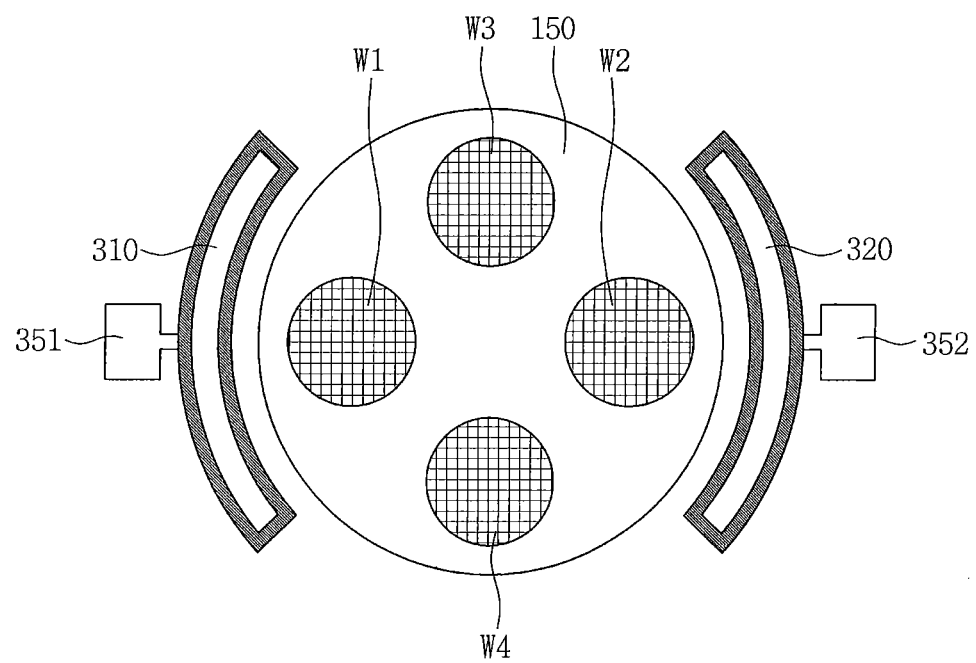
Figure 8B:
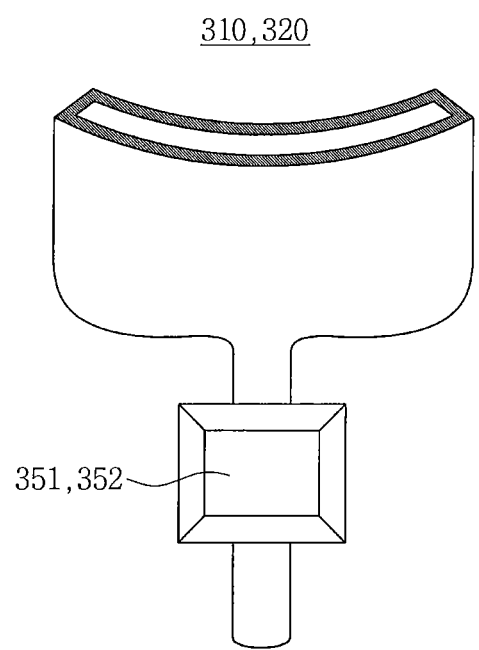

FIGS. 6A, 7A and 8A are top views conceptually illustrating a susceptor 150, first and second gas exhausting pipes 310 and 320, and first and second gas sensors 351 and 352 according to embodiments of the inventive concept. FIGS. 6B, 7B and 8b are perspective views conceptually illustrating the first and second gas exhausting pipes 310 and 320 of FIGS. 6A, 7A and 8A, respectively. Referring to FIGS. 6A to 7B, the first and second gas exhausting pipes 310 and 320 according to the embodiments of the inventive concept may respectively include a plurality of branch exhausting pipes 311a to 311c and 321a to 321c, and main or primary exhausting pipes 312 and 322. Referring to FIGS. 6A and 6B, the first and second gas exhausting pipes 310 and 320 may respectively include two branch exhausting pipes 311*a* and 311*b* and 321*a* and 321*b*, and main exhausting pipes 312 and 322. Referring to FIGS. 7A and 7B, the first and second gas exhausting pipes 310 and 320 may respectively include three branch exhausting pipes 311*a* to 311*c* and 321*a* to 321*c*, and main exhausting pipes 312 and 322. The plurality of branch exhausting pipes 311*a* to 311*c* and 321*a* to 321*c* may be connected to the main exhausting pipes 312 and 322, respectively. Referring to FIGS. 8A and 8B, each of the first and second gas exhausting pipes 310 and 320 may have an arc shape along the periphery of the susceptor 150 in a top view and may have a funnel shape in a side view. The openings O1, O2 (FIGS. 2A and 2B) may be curved and elongated and extend along a portion of the outer periphery of the susceptor 150. Referring to FIGS. 6A to 8B, the first and second gas sensors 351 and 352 may be respectively connected to the main exhausting pipes 312 and 322.

According to the inventive concept, as components of exhausted gases are sensed and analyzed using gas sensors, whether the gases are spatially separated from each other in a chamber can be monitored in real time.

According to the inventive concept, since a spatial division state in the chamber can be monitored, processes and apparatuses can be revised, improved, and modified.

Although a few embodiments have been described with reference to the accompanying drawings, those skilled in the art will readily appreciate that many modifications are possible in embodiments without departing from the scope of the inventive concept and without changing essential features. Therefore, the above-described embodiments should be considered in a descriptive sense only and not for purposes of limitation.

What is claimed is:

1. A semiconductor device manufacturing apparatus, the apparatus comprising:
    a shower head disposed at a top of a chamber;
    a gas supplying part disposed on the shower head;
    a susceptor disposed in the chamber; and
    a gas exhausting part disposed under the chamber, wherein:
    the chamber has a first reaction space and a second reaction space that are virtually separated from each other;
    the gas supplying part includes a first gas supply pipe configured to supply a first gas into the first reaction space and a second gas supply pipe configured to supply a second gas into the second reaction space; and
    the gas exhausting part includes a first gas exhausting pipe disposed adjacent the first reaction space and a second gas exhausting pipe disposed adjacent the second reaction space, the first gas exhausting pipe and the second gas exhausting pipe disposed at opposite sides of the susceptor, a first gas sensor connected to the first gas exhausting pipe and configured to sense the second gas, and a second gas sensor connected to the second gas exhausting pipe and configured to sense the first gas,
    wherein the first gas sensor is directly connected to the first gas exhausting pipe and the second gas sensor is directly connected to the second gas exhausting pipe,
    wherein the first gas sensor is disposed outside the chamber and the second gas sensor is disposed outside the chamber.

2. The apparatus of claim 1, wherein:
    the first gas sensor is insensitive to the first gas and sensitive to the second gas; and
    the second gas sensor is sensitive to the first gas and insensitive to the second gas.

3. The apparatus of claim 1, wherein the first gas sensor does not sense the first gas, and the second gas sensor does not sense the second gas.

4. The apparatus of claim 1, wherein:
    the first gas supply pipe, the first reaction space, and an opening of the first gas exhausting pipe are vertically aligned with each other; and
    the second gas supply pipe, the second reaction space, and an opening of the second gas exhausting pipe are vertically aligned with each other.

5. The apparatus of claim 1, wherein the shower head includes:
    an upper plate having a first gas inlet connected to the first gas supply pipe and a second gas inlet connected to the second gas supply pipe; and
    a lower plate having a plurality of first gas outlets configured to supply the first gas into the first reaction space and a plurality of second gas outlets configured to supply the second gas into the second reaction space.

6. The apparatus of claim 5, wherein:
    the shower head includes a first inner room and a second inner room defined by the upper plate and the lower plate and separated from each other;
    the first gas inlet, the first inner room, and the first reaction space are spatially and vertically aligned with each other; and
    the second gas inlet, the second inner room, and the second reaction space are spatially and vertically aligned with each other.

7. The apparatus of claim 6, wherein the lower plate further includes one or more partitions that protrude upwardly to define the first inner room and the second inner room.

8. The apparatus of claim 1, wherein the gas exhausting part further includes:
    a first gas pump disposed in the first gas exhausting pipe; and
    a second gas pump disposed in the second gas exhausting pipe.

9. The apparatus of claim 1, wherein the first gas exhausting pipe includes an arcuate section that extends along a portion of an outer periphery of the susceptor, and the second gas exhausting pipe includes an arcuate section that extends along another portion of the outer periphery of the susceptor.

10. The apparatus of claim 8, wherein:
    the first gas pump is configured to adjust a flow rate and/or pressure of a first exhaust gas flowing from the first reaction space and through the first gas exhausting pipe in response to the second gas sensor sensing the first gas in the second exhaust gas; and
    the second gas pump is configured to adjust a flow rate and/or pressure of a second exhaust gas flowing from the second reaction space and through the second gas exhausting pipe in response to the first gas sensor sensing the second gas in the first exhaust gas.

11. A semiconductor device manufacturing apparatus, the apparatus comprising:
    a chamber;
    a shower head disposed at a top of the chamber;
    a gas supplying part disposed on the shower head;
    a susceptor disposed in the chamber; and
    a gas exhausting part disposed under the chamber, wherein:

the chamber has a first reaction space and a second reaction space defined therein;

the gas supplying part includes a first gas supply pipe configured to supply a first gas into the first reaction space and a second gas supply pipe configured to supply a second gas into the second reaction space; and the gas exhausting part includes a first gas exhaust pipe disposed adjacent the first reaction space and a second gas exhaust pipe disposed adjacent the second reaction space, the first gas exhaust pipe and the second gas exhaust pipe disposed at opposite sides of the susceptor, a first gas sensor connected to the first gas exhaust pipe and configured to sense the second gas, and a second gas sensor connected to the second gas exhaust pipe and configured to sense the first gas, wherein the first gas sensor is directly connected to the first gas exhaust pipe and the second gas sensor is directly connected to the second gas exhaust pipe, wherein the first gas sensor is disposed outside the chamber and the second gas sensor is disposed outside the chamber.

12. The apparatus of claim 11, wherein:

the first gas sensor is insensitive to the first gas and sensitive to the second gas; and the second gas sensor is sensitive to the first gas and insensitive to the second gas.

13. The apparatus of claim 11, wherein the first gas sensor does not sense the first gas, and the second gas sensor does not sense the second gas.

14. The apparatus of claim 11, wherein the gas exhausting part further includes:

a first gas pump disposed in the first gas exhaust pipe; and a second gas pump disposed in the second gas exhaust pipe.

15. The apparatus of claim 14, wherein:

the first gas pump is configured to adjust a flow rate of a first exhaust gas flowing from the first reaction space and through the first gas exhaust pipe in response to the second gas sensor sensing the first gas in the second exhaust gas; and the second gas pump is configured to adjust a flow rate of a second exhaust gas flowing from the second reaction space and through the second gas exhaust pipe in response to the first gas sensor sensing the second gas in the first exhaust gas.

16. The apparatus of claim 11, wherein the first gas exhaust pipe includes an arcuate section that extends along a portion of an outer periphery of the susceptor, and the second gas exhaust pipe includes an arcuate section that extends along another portion of the outer periphery of the susceptor.

* * * * *